(12) United States Patent
Briant (10) Patent No.: US 10,840,645 B2
(45) Date of Patent: Nov. 17, 2020

(54) LIGHT PIPE ASSEMBLY FOR A RECEPTACLE ASSEMBLY

(71) Applicant: TE CONNECTIVITY CORPORATION, Berwyn, PA (US)

(72) Inventor: Eric David Briant, Dillsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/281,335

(22) Filed: Feb. 21, 2019

(65) Prior Publication Data
US 2020/0274295 A1 Aug. 27, 2020

(51) Int. Cl.
| | |
|---|---|
| *H01R 13/659* | (2011.01) |
| *H01R 13/641* | (2006.01) |
| *F21V 8/00* | (2006.01) |
| *H05K 1/18* | (2006.01) |
| *H01R 12/70* | (2011.01) |
| *H01R 24/50* | (2011.01) |
| *H01R 12/72* | (2011.01) |
| *H01R 13/66* | (2006.01) |
| *H01R 13/717* | (2006.01) |

(52) U.S. Cl.
CPC ........ *H01R 13/641* (2013.01); *G02B 6/0006* (2013.01); *G02B 6/0008* (2013.01); *H01R 12/707* (2013.01); *H01R 12/7064* (2013.01); *H01R 13/659* (2013.01); *H05K 1/181* (2013.01); *H01R 12/724* (2013.01); *H01R 13/6658* (2013.01); *H01R 13/7172* (2013.01); *H01R 24/50* (2013.01); *H05K 2201/10106* (2013.01); *H05K 2201/10189* (2013.01); *H05K 2201/10371* (2013.01)

(58) Field of Classification Search
CPC ...................... H01R 13/6658; H01R 13/7172; H01R 24/50; H01R 12/724; H01R 13/659
USPC ........................................................ 439/490
See application file for complete search history.

(56) References Cited

U.S. PATENT DOCUMENTS

| | | | |
|---|---|---|---|
| 7,529,094 B2 | 5/2009 | Miller | |
| 9,142,922 B2 | 9/2015 | Regnier et al. | |
| 9,391,407 B1 | 7/2016 | Bucher et al. | |
| 9,608,377 B1 | 3/2017 | Phillips et al. | |
| 9,673,570 B2 | 6/2017 | Briant et al. | |
| 2012/0264330 A1* | 10/2012 | Banakis | ............... H01R 12/724 439/569 |

* cited by examiner

*Primary Examiner* — Abdullah A Riyami
*Assistant Examiner* — Justin M Kratt (57) ABSTRACT

A receptacle connector assembly includes a receptacle cage having walls defining a cavity and a divider in the cavity including upper and lower panels separated by a gap and separating the cavity into upper and lower module channels receiving corresponding pluggable modules. The receptacle connector assembly includes a communication connector in the cavity having a housing holding upper and lower contact modules. The receptacle connector assembly includes a light pipe assembly including a first light pipe member coupled to the communication connector and a second light pipe member coupled to the divider. The second light pipe member receives light from the first light pipe member at a separable mating interface.

20 Claims, 3 Drawing Sheets

LIGHT PIPE ASSEMBLY FOR A RECEPTACLE ASSEMBLY

BACKGROUND OF THE INVENTION

The subject matter herein relates generally to receptacle assemblies.

Some communication systems utilize communication connectors to interconnect various components of the system for data communication. Some known communication systems use pluggable modules, such as I/O modules, that are electrically connected to the communication connector. Conventional communication systems have performance problems, particularly when transmitting at high data rates. Known communication systems provide electrical shielding, such as in the form of a receptacle cage surrounding a communication connector and the pluggable module to provide electrical shielding. However, assembly of such communication systems is problematic. For example, the communication connector is typically press-fit to the circuit board with the receptacle cage during a single press fit operation. Routing of light pipes in such systems is difficult and may block airflow through the systems.

A need remains for a communication system that may be assembled in a cost effective and reliable manner.

BRIEF DESCRIPTION OF THE INVENTION

In one embodiment, a receptacle connector assembly includes a receptacle cage configured to be mounted to a circuit board having walls defining a cavity and a divider in the cavity including an upper panel and a lower panel separated by a gap separating the cavity into an upper module channel configured to receive an upper pluggable module and a lower module channel configured to receive a lower pluggable module. The receptacle connector assembly includes a communication connector configured to be mounted to the circuit board. The communication connector is received in the cavity. The communication connector has a housing holding an upper contact module and a lower contact module. The upper contact module has upper contacts aligned with the upper module channel for mating with the upper pluggable module and the lower contact module has lower contacts aligned with the lower module channel for mating with the lower pluggable module. The receptacle connector assembly includes a light pipe assembly including a first light pipe member coupled to the communication connector and a second light pipe member coupled to the divider. The second light pipe member receives light from the first light pipe member at a separable mating interface.

In another embodiment, a receptacle connector assembly is provided including a receptacle cage configured to be mounted to a circuit board having walls defining a cavity. The receptacle cage has a front end. The receptacle cage has a divider in the cavity including an upper panel and a lower panel separated by a gap. The divider separates the cavity into an upper module channel open at the front end configured to receive an upper pluggable module and a lower module channel open at the front end configured to receive a lower pluggable module. The receptacle connector assembly includes a communication connector received in the cavity. The communication connector has a housing extending between a front and a rear. The front faces the divider and the upper and lower pluggable modules. The housing has a top and a bottom. The bottom is mounted to the circuit board. The housing holds an upper contact module and a lower contact module. The upper contact module has upper contacts aligned with the upper module channel for mating with the upper pluggable module. The lower contact module has lower contacts aligned with the lower module channel for mating with the lower pluggable module. The receptacle connector assembly includes a light pipe assembly including a first light pipe member coupled to the communication connector and a second light pipe member coupled to the divider. The first light pipe member includes a first light receiving end and a first light emitting end. The first light receiving end is configured to receive light from an LED mounted to the circuit board. The first light emitting end is arranged at the front of the housing and faces the divider. The second light pipe member includes a second light receiving end and a second light emitting end. The second light emitting end is arranged at the front end of the receptacle cage. The second light receiving end is arranged adjacent the first light emitting end to receive light from the first light pipe member at a separable mating interface.

In a further embodiment, a receptacle connector assembly is provided including a receptacle cage configured to be mounted to a circuit board. The receptacle cage has walls defining a cavity. The receptacle cage has a divider in the cavity including an upper panel and a lower panel separated by a gap. The divider separates the cavity into an upper module channel configured to receive an upper pluggable module and a lower module channel configured to receive a lower pluggable module. The divider extends between a front and a rear. The divider has a light pipe holder at the rear. The light pipe holder has a light pipe channel. The receptacle connector assembly includes a communication connector configured to be mounted to the circuit board. The communication connector is received in the cavity. The communication connector has a housing extending between a front and a rear. The front faces the divider and the upper and lower contact modules. The housing has a top and a bottom. The bottom is mounted to the circuit board. The housing has an upper extension extending from the front including an upper mating slot configured to receive the upper pluggable module. The housing has a lower extension extending from the front including a lower mating slot configured to receive the lower pluggable module. The housing holds an upper contact module and a lower contact module. The upper contact module has upper contacts extending into the upper mating slot for mating with the upper pluggable module. The lower contact module has lower contacts extending into the lower mating slot for mating with the lower pluggable module. The housing has a platform extending from the front between the upper extension and the lower extension. The platform is aligned with the divider and has a light pipe channel. The receptacle connector assembly includes a light pipe assembly including a first light pipe member received in the light pipe channel of the platform and a second light pipe member received in the light pipe channel of the light pipe holder. The second light pipe member receives light from the first light pipe member at a separable mating interface.

DETAILED DESCRIPTION OF THE INVENTION

Figure 1:
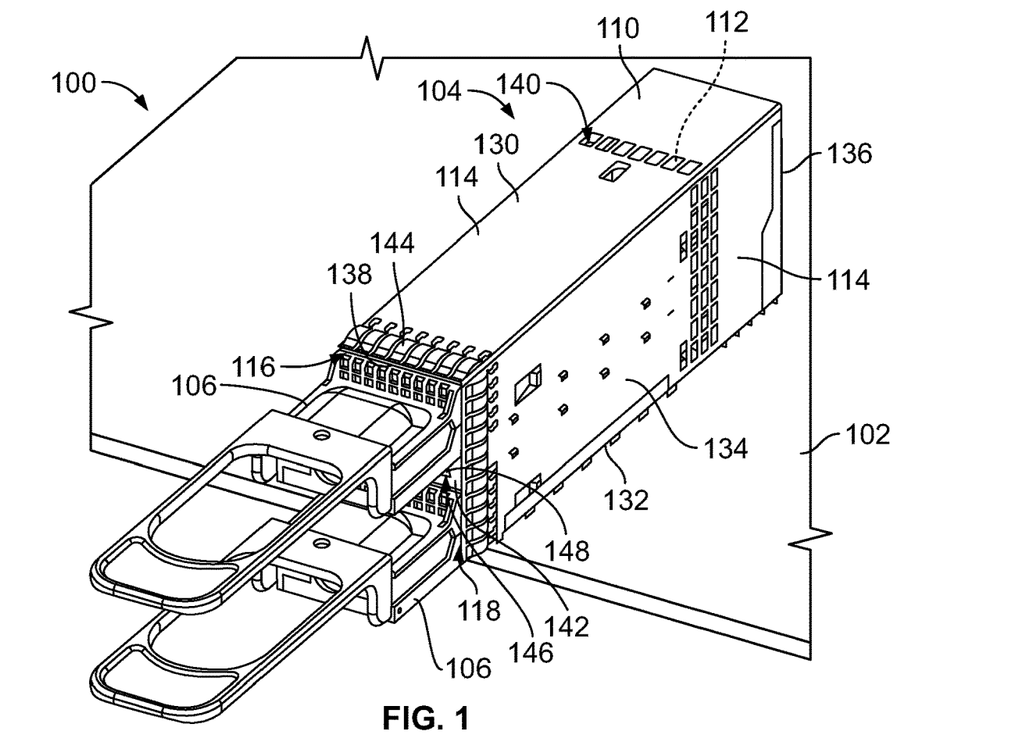
FIG. 1 is a front perspective view of a communication system formed in accordance with an exemplary embodiment.
Figure 2:
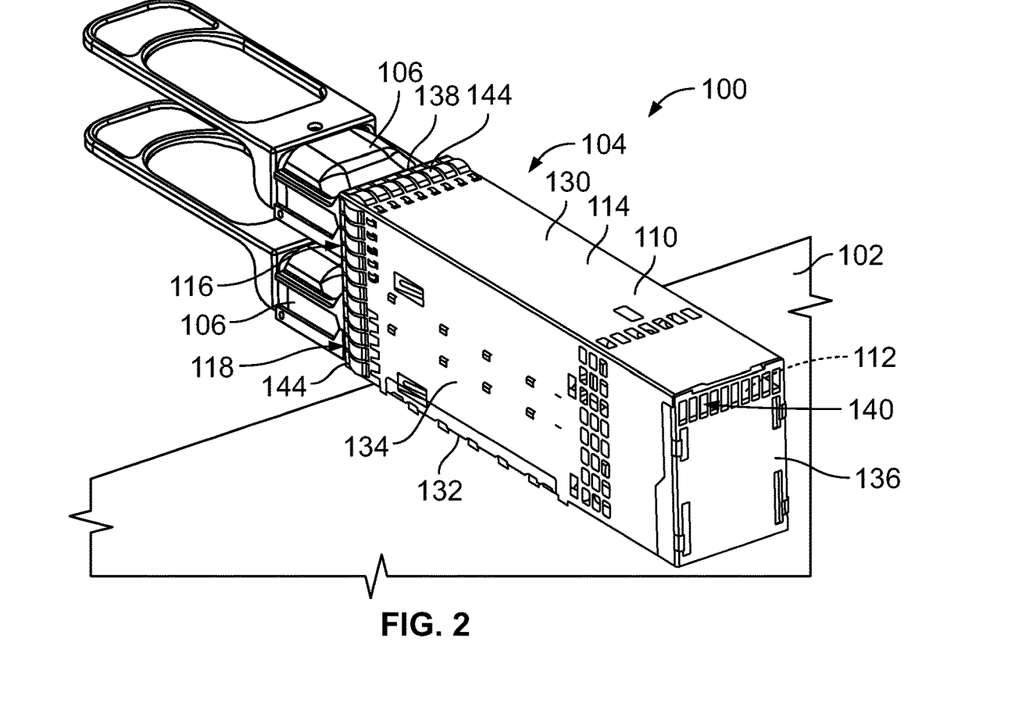
FIG. 2 is a rear perspective view of the communication system formed in accordance with an exemplary embodiment.

FIG. 1 is a front perspective view of a communication system 100 formed in accordance with an exemplary embodiment. FIG. 2 is a rear perspective view of the communication system 100 formed in accordance with an exemplary embodiment. The communication system includes a circuit board 102 and a receptacle connector assembly 104 mounted to the circuit board 102. Pluggable modules 106 are configured to be electrically connected to the receptacle connector assembly 104. The pluggable modules 106 are electrically connected to the circuit board 102 through the receptacle connector assembly 104.

In an exemplary embodiment, the receptacle connector assembly 104 includes a receptacle cage 110 and a communication connector 112 (also shown in FIGS. 3 and 4) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 is enclosed and provides electrical shielding for the communication connector 112. The pluggable modules 106 are loaded into the receptacle cage 110 and are at least partially surrounded by the receptacle cage 110. The receptacle cage 110 includes a plurality of walls 114 that define one or more module channels for receipt of corresponding pluggable modules 106. The walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the walls 114 being shielding walls. In other embodiments, the receptacle cage 110 may be open between frame members, such as rails or beams, to provide cooling airflow for the pluggable modules 106 with the frame members of the receptacle cage 110 defining guide tracks for guiding loading of the pluggable modules 106 into the receptacle cage 110.

In the illustrated embodiment, the receptacle cage 110 constitutes a stacked cage member having an upper module channel 116 and a lower module channel 118. The receptacle cage 110 has module ports that open to the module channels 116, 118 that receive the pluggable modules 106. Any number of module channels may be provided in various embodiments. In the illustrated embodiment, the receptacle cage 110 includes the upper and lower module channels 116, 118 arranged in a single column, however, the receptacle cage 110 may include multiple columns of ganged module channels 116, 118 in alternative embodiments (for example, 2×2, 3×2, 4×2, 4×3, etc.). The receptacle connector assembly 104 is configured to mate with the pluggable modules 106 in both stacked module channels 116, 118. Optionally, multiple communication connectors 104 may be arranged within the receptacle cage 110, such as when multiple columns of module channels 116, 118 are provided.

In an exemplary embodiment, the walls 114 of the receptacle cage 110 include a top wall 130, a bottom wall 132, side walls 134, and a rear wall 136. The bottom wall 132 may rest on the circuit board 102. However, in alternative embodiments, the receptacle cage 110 may be provided without the bottom wall 132. The receptacle cage 110 extends to a front end 138. The module ports are provided at the front end 138. The walls 114 define a cavity 140. For example, the cavity 140 may be defined by the top wall 130, the bottom wall 132, the side walls 134, and the rear wall 136. Other walls 114 may separate or divide the cavity 140 into the various module channels 116, 118. For example, the walls 114 include a divider 142 between the upper and lower module channels 116, 118. The divider 142 forms a space between the upper and lower module channels 116, 118, such as for airflow, for routing light pipes, or for other purposes. In other various embodiments, the walls 114 may include vertical separator panels between ganged module channels 116 and/or 118.

In an exemplary embodiment, the receptacle cage 110 may include one or more gaskets 144 at the front end 138 for providing electrical shielding for the module channels 116, 118. For example, the gaskets 144 may be configured to electrically connect with the pluggable modules 106 received in the corresponding module channels 116, 118. The gaskets 144 are configured to engage a panel (not shown) to electrically connect the receptacle cage 110 to the panel.

In an exemplary embodiment, the receptacle connector assembly 104 may include one or more heat sinks (not shown) for dissipating heat from the pluggable modules 106. For example, the heat sink may be coupled to the top wall 130 for engaging the upper pluggable module 106 received in the upper module channel 116. The heat sink may extend through an opening in the top wall 130 to directly engage the pluggable module 106. Other types of heat sinks may be provided in alternative embodiments.

In an exemplary embodiment, the receptacle connector assembly 104 includes a light pipe assembly 146 having light pipes 148 indicating connectivity status of the pluggable modules 106 within the communication system 100. The light pipe assembly 146 is coupled to the receptacle cage 110. For example, the light pipe assembly 146 is coupled to the divider 142. The light pipe assembly 146 is coupled to the communication connector 112. The light pipe assembly may receive light from the LEDs (not shown) mounted to the circuit board 102 beneath the communication connector 112.

In an exemplary embodiment, the communication connector 112 is received in the cavity 140, such as proximate to the rear wall 136. However, in alternative embodiments, the communication connector 112 may be located behind the rear wall 136 exterior of the receptacle cage 110 and extend through an opening in the rear wall 136 into the cavity 140 to interface with the pluggable module(s) 106. In an exemplary embodiment, a single communication connector 112 is used to electrically connect with the pair of stacked pluggable modules 106 in the upper and lower module channels 116, 118. In alternative embodiments, the communication system 100 may include discrete, stacked communication connectors 112 (for example, an upper communication connector and a lower communication connector) for mating with the corresponding pluggable modules 106.

In an exemplary embodiment, the pluggable modules 106 are loaded into the receptacle cage 100 through the front end 138 to mate with the communication connector 112. The shielding walls 114 of the receptacle cage 110 provide electrical shielding around the communication connector 112 and the pluggable modules 106, such as around the mating interfaces between the communication connector 112 and the pluggable modules 106. The communication connector 112 is coupled to the circuit board 102. For example, the communication connector 112 may be surface mounted to the circuit board 102 in various embodiments. In alternative embodiments, the communication connector 112 may be press-fit to the circuit board 102. The receptacle cage 110 is mounted to the circuit board 102 over the communication connector 112. Optionally, a second receptacle cage (not shown) may be mounted to the opposite side of the circuit board 102 over a second communication connector (not shown).

Figure 3:
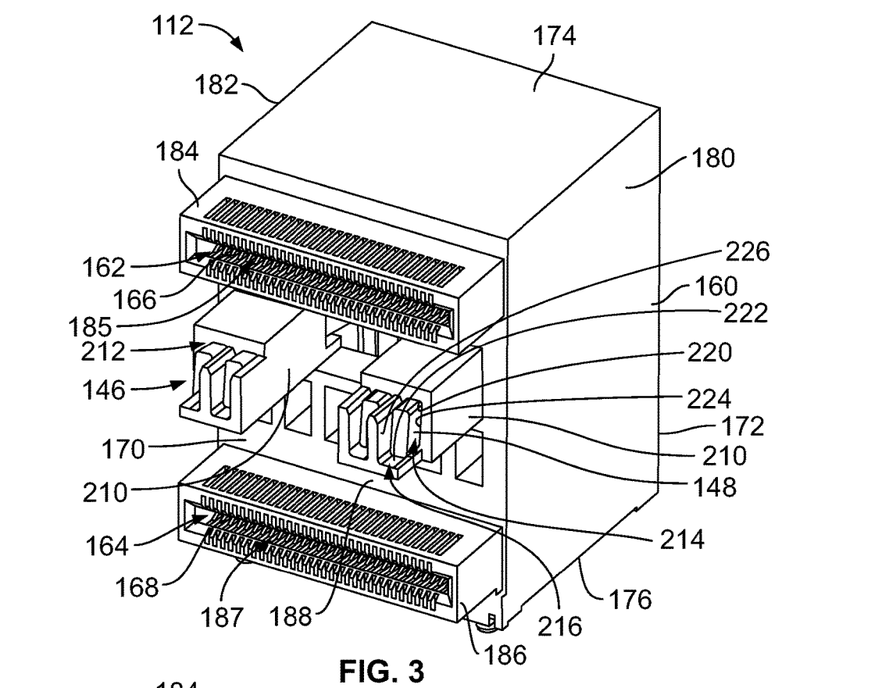
FIG. 3 is a front perspective view of a communication connector of the communication system in accordance with an exemplary embodiment.
Figure 4:
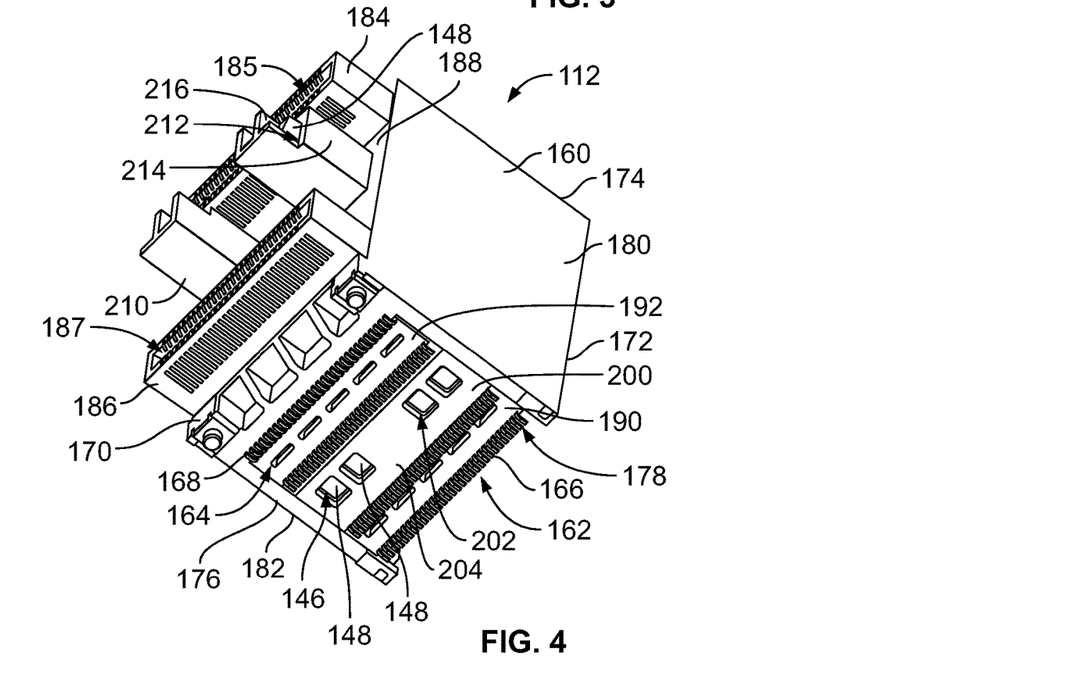
FIG. 4 is a bottom perspective view of the communication connector in accordance with an exemplary embodiment.

FIG. 3 is a front perspective view of the communication connector 112 in accordance with an exemplary embodiment. FIG. 4 is a bottom perspective view of the communication connector 112 in accordance with an exemplary embodiment. The communication connector 112 includes a housing 160 holding an upper contact module 162 and a lower contact module 164. The upper contact module 162 includes a plurality of upper contacts 166 and the lower contact module 164 has a plurality of lower contacts 168. The upper contacts 166 may be arranged in multiple rows within the housing 160 and/or the lower contacts 168 may be arranged in multiple rows within the housing 160.

The housing 160 extends between a front 170 and a rear 172. The housing 160 has a top 174 and a bottom 176. The housing 160 has a cavity 178 open at the bottom 176 and/or the rear 172 to receive the upper and lower contact modules 162, 164. The housing 160 includes a first side 180 and a second side 182. In the illustrated embodiment, the housing 160 is a single piece housing manufactured from a dielectric material. For example, the housing 160 may be molded from a plastic material. However, in alternative embodiments, the housing 160 may be a multipiece housing manufactured from multiple pieces, such as an upper housing and a lower housing, or a front housing and a rear housing.

The housing 160 includes an upper extension 184 having an upper mating slot 185 (FIG. 3) configured to receive a portion of the upper pluggable module 106 (shown in FIG. 1). The housing 160 includes a lower extension 186 having a lower mating slot 187 (FIG. 3) configured to receive a portion of the lower pluggable module 106 (shown in FIG. 1). The extensions 184 extend forward of a front wall 188 at the front 170 of the housing 160. The mating slots 185, 187 defined card slots configured to receive circuit cards. Other types of receptacle's may be provided in alternative embodiments. The upper contacts 166 are arranged in the upper mating slot 185 four mating with the upper pluggable module 106. The lower contacts 168 are arranged in the lower mating slot 187 for mating with the lower pluggable module 106.

In an exemplary embodiment, the upper contact module 162 and the lower contact module 164 transition between the front 170 and the bottom 176 to electrically connect the pluggable modules 106 with the circuit board 102 (shown in FIG. 1). The upper contacts 166 transition from the upper mating slot 185 to the bottom 176 for termination to the circuit board 102. In various embodiments, the upper contacts 166 may be surface mounted to the circuit board 102. For example, the upper contacts 166 may include solder tails configured to be surface mounted to the circuit board 102. In alternative embodiments, the upper contacts 166 may include compliant pins configured to be press-fit into the circuit board 102. In an exemplary embodiment, the upper contact module 162 includes a contact holder 190 (FIG. 4) configured to hold the upper contacts 166. The contact holder 190 may be coupled to the housing 160, such as at the bottom 176.

The lower contacts 168 transition from the lower mating slot 187 to the bottom 176 for termination to the circuit board 102. In various embodiments, the lower contacts 166 may be surface mounted to the circuit board 102. For example, the lower contacts 168 may include solder tails configured to be surface mounted to the circuit board 102. In alternative embodiments, the lower contacts 168 may include compliant pins configured to be press-fit into the circuit board 102. In an exemplary embodiment, the lower contact module 164 includes a contact holder 192 (FIG. 4) configured to hold the lower contacts 168. The contact holder 192 may be coupled to the housing 160, such as at the bottom 176.

In an exemplary embodiment, the communication connector 112 includes a light pipe holder 200 (FIG. 4) forming a portion of the light pipe assembly 146. The light pipe holder 200 holds the light pipes 148. The light pipe holder 200 is coupled to the housing 160, such as at the bottom 176. The light pipe holder 200 may be coupled to the housing 160 between the contact holder 190 and the contact holder 192. The light pipe holder 200 includes pockets 202 open at a bottom 204 of the light pipe holder 200. The pockets 202 are located below the light pipes 148. The pockets 202 are configured to receive LEDs mounted to the circuit board 102.

In an exemplary embodiment, the housing 160 includes one or more platforms 210 extending forward from the front wall 188. Each platform 210 holds a corresponding light pipe(s) 148. In various embodiments, one or more platforms 210 may be integrated as a single, unitary structure. The platforms 210 are located between the upper and lower extensions 184, 186. Each platform 210 includes a light pipe channel 212 receiving the corresponding light pipe 148. In an exemplary embodiment, the light pipes 148 extend from the front of the housing 160 through the light pipe channels 212 into the cavity 178 of the housing 160, or the light pipes transition to the light pipe holder 200. Portions of the light pipes 148 are enclosed by the housing 160 and portions of the light pipes 148 are exposed. For example, the light pipe channel 212 includes a closed portion 214 and an open portion 216. The light pipe 148 is supported by the light pipe channel 212 along the closed portion 214 and is supported by the light pipe channel 212 along the open portion 216. The light pipe channel 212 is defined by a top wall 220, a bottom wall 222, a side wall 224, a side wall 226. In the illustrated embodiment, the bottom wall 222 is longer than the top wall 220 forming the open portion 216. In various embodiments, some side walls 224 may be longer than other side walls 226. In other various embodiments, some side walls 226 may be longer than other side walls 224. The light pipes 148 are exposed from above at the open portion 216 for mating with other portions of the light pipe, as described in further detail below.

Figure 5:
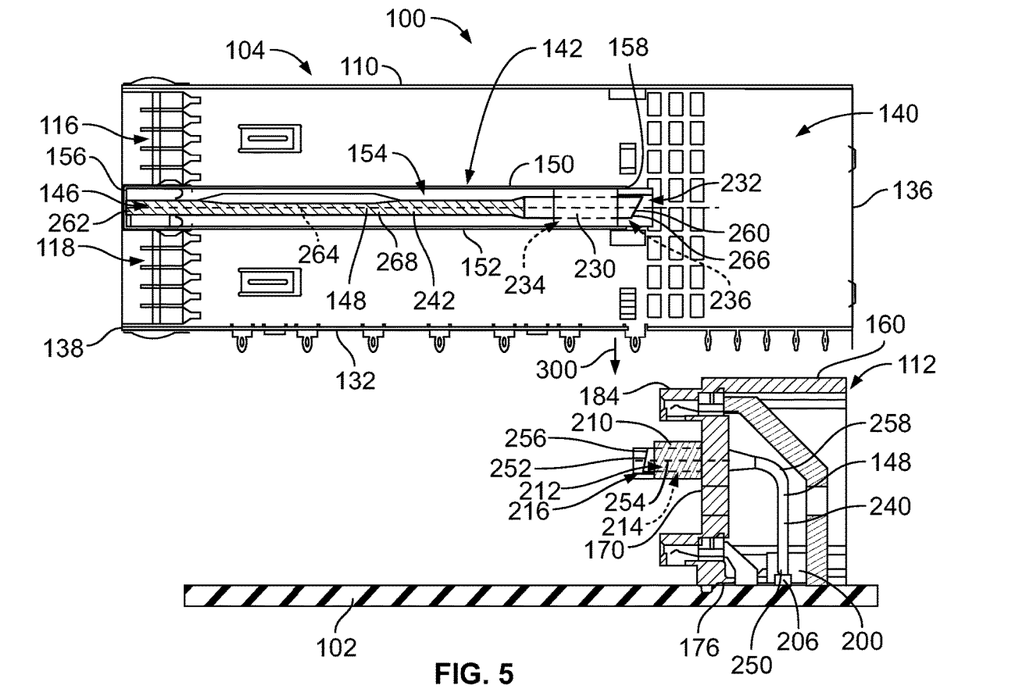
FIG. 5 is a cross-sectional view of a receptacle connector assembly of the communication system in accordance with an exemplary embodiment.
Figure 6:
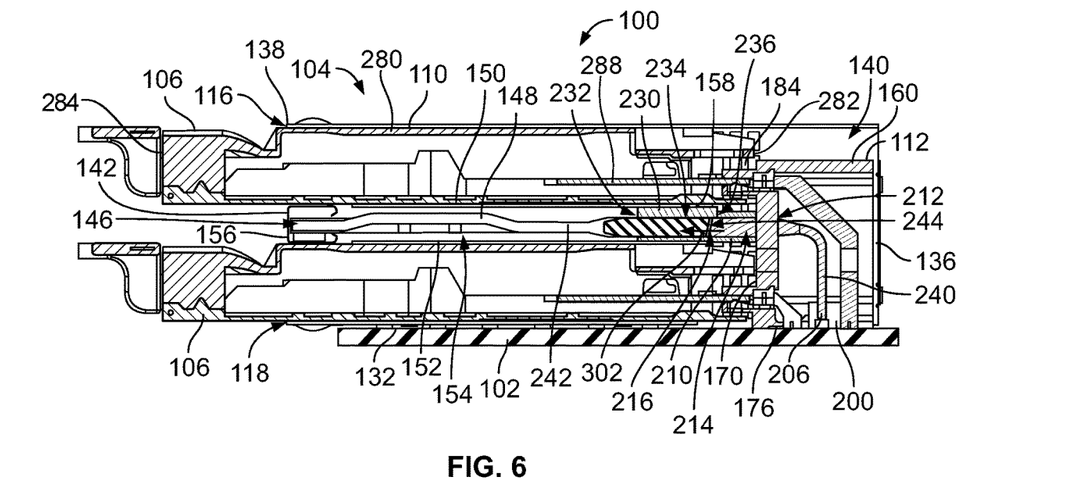
FIG. 6 is a cross-sectional view of the communication system in accordance with an exemplary embodiment.

FIG. 5 is a cross-sectional view of the receptacle connector assembly 104 in a partially assembled state showing the receptacle cage 110 poised for coupling to the circuit board 102 over the communication connector 112. FIG. 6 is a cross-sectional view of the communication system 100 in an assembled state showing the receptacle cage 110 coupled to the circuit board 102 over the communication connector 112 and showing the pluggable modules 106 electrically connected to the communication connector 112.

The divider 142 includes an upper panel 150 and a lower panel 152 separated by a gap 154. The divider 142 separates the cavity 140 into the upper module channel 116 and the lower module channel 118. The gap 154 provide a space for the light pipe assembly 146. The divider 142 extends between a front 156 and a rear 158. The front 156 is provided at the front end 138 of the receptacle cage 110. The rear 158 is spaced apart from the rear wall 136 providing a space that receives the communication connector 112. The divider 142 is located vertically above the bottom wall 132, which is also spaced apart from the rear wall 136, leaving an opening that receives the communication connector 112 as the receptacle cage 110 is lowered onto the circuit board 102.

In an exemplary embodiment, the divider 142 includes a light pipe holder 230 that holds a portion of the light pipe assembly 146. In the illustrated embodiment, the light pipe holder 230 is provided at the rear 158 of the divider 142. Optionally, the light pipe holder 230 may extend rearward of the divider 142, such as into the space rearward of the divider 142. The light pipe holder 230 positions the light pipes 148 relative to the upper panel 150 and the lower panel 152 within the gap 154. The light pipe holder 230 may position the light pipes 148 for mating with other portions of the light pipes 148 held by the communication connector 112. The light pipe holder 230 includes light pipe channels 232 that receive corresponding light pipes 148. In an exemplary embodiment, similar to the light pipe channels 212 of the platforms 210, the light pipe channels 232 include closed portions 234 and open portions 236.

The light pipe assembly 146 includes a first light pipe member 240 and a second light pipe member 242. The first light pipe member 240 is coupled to the communication connector 112. The second light pipe member 242 is coupled to the divider 142. The second light pipe member 242 is coupled to the first light pipe member 240 at a separable mating interface 244 (FIG. 6). When the receptacle cage 110 is lowered onto the circuit board 102 over the communication connector 112, the ends of the first and second light pipe members 240, 242 are aligned at the separable mating interface 244 to communicatively coupled to the first light pipe member 240 with the second light pipe member 242. Light signals may be transmitted from the first light pipe member 240 to the second light pipe member 242 across the separable mating interface 244.

With reference to FIG. 5, the first light pipe member 240 includes a first light receiving end 250 and a first light emitting end 252 opposite the first light receiving end 250. The light receiving end 250 is held by the light pipe holder 200 at the bottom 176 of the housing 160. The light receiving end 250 receives light from an LED 206 mounted to the circuit board 102. The light emitting end 252 is received in the light pipe channel 212 at the platform 210 at the front 170 of the housing 160. The light emitting end 252 extends to the open portion 216 of the light pipe channel 212. The light emitting end 252 is exposed in the light pipe channel 212 for mating with the second light pipe member 242. In an exemplary embodiment, the first light pipe member 240 extends along an axis 254 at the light emitting end 252. The light emitting end 252 is cut at an angle such that a tip 256 of the light emitting end 252 is angled transverse to the axis 254. In an exemplary embodiment, the tip 256 of the light emitting end 252 is upward and forward facing.

The first light pipe member 240 has a light transmitting body 258 between the first light receiving end 250 and the first light emitting end 252. The light transmitting body 258 may transmit light between the light receiving end 250 and the light emitting end 252 by total internal reflection. In the illustrated embodiment, the light transmitting body 258 transitions through a 90° bend between the light receiving end 250 and the light emitting end 252.

With reference to FIG. 5, the second light pipe member 242 includes a second light receiving end 260 and a second light emitting end 262 opposite the second light receiving end 260. The light emitting end 262 is located at the front end 138 of the receptacle cage 110 and visible from the exterior of the receptacle cage by an operator to monitor the operation of the communication system 100. The light receiving end 260 is held by the light pipe holder 230 in the divider 142. The light receiving end 260 receives light from the first light pipe member 240. The light receiving end 260 extends to the open portion 236 of the light pipe channel 232. The light receiving end 260 is exposed in the light pipe channel 232 for mating with the first light pipe member 240. In an exemplary embodiment, the second light pipe member 242 extends along an axis 264 at the light receiving end 260. The light receiving end 260 is cut at an angle such that a tip 266 of the light receiving end 260 is angled transverse to the axis 264. In an exemplary embodiment, the tip 266 of the light receiving end 260 is downward and rearward facing.

The second light pipe member 240 has a light transmitting body 268 between the second light receiving end 260 and the second light emitting end 262. The light transmitting body 268 may transmit light between the light receiving end 260 and the light emitting end 262 by total internal reflection.

With reference to FIGS. 5 and 6, during assembly, the first light pipe member 240 is preloaded in the communication connector 112 and the second light pipe member 242 is preloaded in the divider 142 of the receptacle cage 110. The communication connector 112 is mounted to the circuit board 102 prior to the receptacle cage 110. During mating, the receptacle cage 110 is aligned over the communication connector 112 and lowered in a downward mating direction 300 (FIG. 5). The light pipe holder 230 is offset are staggered forward of the upper extension 184 such that the light pipe holder 230 does not interfere with the upper extension 184 as the receptacle cage 110 is lowered onto the circuit board 102. The light pipe holder 230 is aligned with the platform 210 such that the light pipe holder 230 interfaces with the platform 210 as the receptacle cage 110 is lowered onto the circuit board 102. The first and second light pipe members 240, 242 interface with each other at the separable mating interface 244 (FIG. 6) when mated. Having the tips 256, 266 angled eases mating between the first and second light pipe members 240, 242. The angled mating interface 244 prevents stubbing during mating. The angled mating interface limits back reflection of light transmission across the interface between the light pipe members 240, 242. When the light pipe holder 230 and the platform 210 are coupled together, the mating interface 244 is enclosed. The light pipe holder 230 and the platform 210 surround the first and second light pipe members 240, 242. For example, the closed portion 234 of the light pipe holder 230 closes off the open portion 216 of the platform 210 and the closed portion 214 of the platform 210 closes off the open portion 236 of the light pipe holder 230 entirely closing off the light pipe channels through the light pipe holder 230 and the platform 210. For example, the light emitting end 252 of the first light pipe member 240 and the light receiving end 260 of the second light pipe member 242 are closed along the top, along the bottom, along the first side, and along the second side.

In an exemplary embodiment, the tips 256, 266 defining the separable mating interface 244 are angled transverse to the mating direction 300. The tips 256, 266 defining the separable mating interface 244 are angled transverse to the longitudinal axes 254, 264 through the ends 252, 260. The tips 256, 266 defining the separable mating interface 244 are angled transverse to the light emitting direction 302 (FIG. 6).

In an exemplary embodiment, when assembled, the platform 210 is coupled to the light pipe holder 230. The platform 210 holds the light emitting end 252 of the first light pipe member 240 at the open portion 216. The platform 210 receives a portion of the light receiving end 260 of the second light pipe member 242 when the light pipe holder 230 is coupled to the platform 210. In an exemplary embodiment, the open portion 236 of the light pipe holder 230 receives a portion of the light emitting end 252 of the first light pipe member 240. As such, the first and second light pipe members 240, 242 are co-received in the platform 210 and the light pipe holder 230. The platform 210 and the light pipe holder 230 may dielectric covering for the first and second light pipe members 240, 242 at the separable mating interface 244. The edges of the platform 210 and the light pipe holder 230 are offset from the mating interface 244 to ensure that the mating interface 244 is covered and ensure that light does not escape.

With reference to FIG. 6, the pluggable modules 106 may be I/O modules, such as transceiver modules. In an exemplary embodiment, each pluggable module 106 has a pluggable body 280, which may be defined by one or more shells. The pluggable body 280 may be thermally conductive and/or may be electrically conductive, such as to provide EMI shielding for the pluggable module 106. The pluggable body 280 includes a mating end 282 and an opposite front end 284. The mating end 282 is configured to be inserted into the corresponding module channel 116 or 118. The front end 284 may be a cable end having a cable extending therefrom to another component within the system. The pluggable module 106 includes a module circuit board 288 that is configured to be communicatively coupled to the communication connector 112. The module circuit board 288 may have conductors, traces, pads, electronics, sensors, controllers, switches, inputs, outputs, and the like associated with the module circuit board 288 to form various circuits.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle connector assembly comprising:
a receptacle cage configured to be mounted to a circuit board, the receptacle cage having walls defining a cavity, the receptacle cage having a divider in the cavity including an upper panel and a lower panel separated by a gap, the divider separating the cavity into an upper module channel configured to receive an upper pluggable module and a lower module channel configured to receive a lower pluggable module;
a communication connector configured to be mounted to the circuit board, the communication connector received in the cavity, the communication connector having a housing holding an upper contact module and a lower contact module, the upper contact module having upper contacts aligned with the upper module channel for mating with the upper pluggable module, the lower contact module having lower contacts aligned with the lower module channel for mating with the lower pluggable module; and
a light pipe assembly including a first light pipe member coupled to the communication connector and a second light pipe member coupled to the divider, the second light pipe member receiving light from the first light pipe member at a separable mating interface.

2. The receptacle connector assembly of claim 1, wherein the first and second light pipe modules are mated in a mating direction generally perpendicular to a light emitting direction through the light pipe assembly across the separable mating interface.

3. The receptacle connector assembly of claim 1, wherein the second light pipe member extends along a longitudinal axis, the separable mating interface being angled transverse to the longitudinal axis.

4. The receptacle connector assembly of claim 1, wherein the first light pipe member has a light emitting end and the second light pipe member has a light receiving end receiving light from the light emitting end at the separable mating interface in a light emitting direction, the separable mating interface being angled transverse to the light emitting direction.

5. The receptacle connector assembly of claim 1, wherein the second light pipe member is received in the gap of the divider and lowered onto the circuit board over the communication connector to mate the second light pipe member with the first light pipe member in a downward mating direction, the separable mating interface being angled transverse to the mating direction.

6. The receptacle connector assembly of claim 1, wherein the first light pipe member includes a first light receiving end and a first light emitting end, the first light receiving end configured to receive light from an LED mounted to the circuit board, the first light emitting end arranged at a front of the housing and facing the divider, the second light pipe member including a second light receiving end and a second light emitting end, the second light emitting end arranged at a front end of the receptacle cage, the second light receiving end arranged adjacent the first light emitting end to receive light from the first light pipe member at the separable mating interface.

7. The receptacle connector assembly of claim 1, wherein the housing includes a platform extending from a front of the housing toward the divider, the platform having a light pipe channel receiving the first light pipe member.

8. The receptacle connector assembly of claim 7, wherein the platform receives an end of the second light pipe member.

9. The receptacle connector assembly of claim 7, wherein the divider includes a light pipe holder received in the gap, the light pipe holder having a light pipe channel receiving the second light pipe member, the light pipe holder being coupled to the platform.

10. The receptacle connector assembly of claim 9, wherein the platform and the light pipe holder enclose the separable mating interface.

11. The receptacle connector assembly of claim 9, wherein the platform receives an end of the second light pipe member and the light pipe holder receives an end of the first light pipe holder.

12. The receptacle connector assembly of claim 1, wherein the separable mating interface is enclosed in a dielectric covering.

13. The receptacle connector assembly of claim 1, wherein the communication connector is surface mounted to the circuit board.

14. The receptacle connector assembly of claim 1, wherein the first light pipe member is located between the upper contact module and the lower contact module.

15. A receptacle connector assembly comprising:
a receptacle cage configured to be mounted to a circuit board, the receptacle cage having walls defining a cavity, the receptacle cage having a front end, the receptacle cage having a divider in the cavity including an upper panel and a lower panel separated by a gap, the divider separating the cavity into an upper module channel open at the front end configured to receive an upper pluggable module and a lower module channel open at the front end configured to receive a lower pluggable module;
a communication connector received in the cavity, the communication connector having a housing extending between a front and a rear, the front facing the divider and the upper and lower pluggable modules, the housing having a top and a bottom, the bottom being mounted to the circuit board, the housing holding an upper contact module and a lower contact module, the upper contact module having upper contacts aligned with the upper module channel for mating with the upper pluggable module, the lower contact module having lower contacts aligned with the lower module channel for mating with the lower pluggable module; and
a light pipe assembly including a first light pipe member coupled to the communication connector and a second light pipe member coupled to the divider, the first light pipe member including a first light receiving end and a first light emitting end, the first light receiving end configured to receive light from an LED mounted to the circuit board, the first light emitting end arranged at the front of the housing and facing the divider, the second light pipe member including a second light receiving end and a second light emitting end, the second light emitting end arranged at the front end of the receptacle cage, the second light receiving end arranged adjacent the first light emitting end to receive light from the first light pipe member at a separable mating interface.

16. The receptacle connector assembly of claim 15, wherein the second light pipe member is received in the gap of the divider and lowered onto the circuit board over the communication connector to mate the second light pipe member with the first light pipe member in a downward mating direction, the separable mating interface being angled transverse to the mating direction.

17. The receptacle connector assembly of claim 15, wherein the housing includes a platform extending from a front of the housing toward the divider, the platform having a light pipe channel receiving the first light pipe member and the second light pipe member.

18. The receptacle connector assembly of claim 15, wherein the housing includes a platform extending from a front of the housing toward the divider, the platform having a light pipe channel receiving the first light pipe member, and wherein the divider includes a light pipe holder received in the gap, the light pipe holder having a light pipe channel receiving the second light pipe member, the light pipe member holder being coupled to the platform.

19. A receptacle connector assembly comprising:
a receptacle cage configured to be mounted to a circuit board, the receptacle cage having walls defining a cavity, the receptacle cage having a divider in the cavity including an upper panel and a lower panel separated by a gap, the divider separating the cavity into an upper module channel configured to receive an upper pluggable module and a lower module channel configured to receive a lower pluggable module, the divider extending between a front and a rear, the divider having a light pipe holder at the rear, the light pipe holder having a light pipe channel;
a communication connector configured to be mounted to the circuit board, the communication connector received in the cavity, the communication connector having a housing extending between a front and a rear, the front facing the divider and the upper and lower contact modules, the housing having a top and a bottom, the bottom being mounted to the circuit board, the housing having an upper extension extending from the front including an upper mating slot configured to receive the upper pluggable module, the housing having a lower extension extending from the front including a lower mating slot configured to receive the lower pluggable module, the housing holding an upper contact module and a lower contact module, the upper contact module having upper contacts extending into the upper mating slot for mating with the upper pluggable module, the lower contact module having lower contacts extending into the lower mating slot for mating with the lower pluggable module, the housing having a platform extending from the front between the upper extension and the lower extension, the platform being aligned with the divider, the platform having a light pipe channel; and
a light pipe assembly including a first light pipe member received in the light pipe channel of the platform and a second light pipe member received in the light pipe channel of the light pipe holder, the second light pipe member receiving light from the first light pipe member at a separable mating interface.

20. The receptacle connector assembly of claim 19, wherein the second light pipe member is received in the gap of the divider and lowered onto the circuit board over the communication connector to mate the second light pipe member with the first light pipe member in a downward mating direction, the separable mating interface being angled transverse to the mating direction.

\* \* \* \* \*